(12) United States Patent
Patel

(10) Patent No.: US 9,379,735 B1
(45) Date of Patent: Jun. 28, 2016

(54) METHOD AND APPARATUS FOR SIGNAL SATURATION

(71) Applicant: MBIT WIRELESS, INC., Newport Beach, CA (US)

(72) Inventor: Bhaskar Patel, San Clemente, CA (US)

(73) Assignee: MBIT WIRELESS, INC., Irvine, CA (US)

( * ) Notice: Subject to any disclaimer, the term of this patent is extended or adjusted under 35 U.S.C. 154(b) by 0 days.

(21) Appl. No.: 14/886,583

(22) Filed: Oct. 19, 2015

(51) Int. Cl.
| | |
|---|---|
| *H03M 1/70* | (2006.01) |
| *H03M 7/20* | (2006.01) |
| *H03M 7/00* | (2006.01) |
| *H03M 7/04* | (2006.01) |
| *H03M 7/30* | (2006.01) |

(52) U.S. Cl.
CPC *H03M 7/20* (2013.01); *H03M 7/00* (2013.01); *H03M 7/001* (2013.01); *H03M 7/04* (2013.01); *H03M 7/30* (2013.01)

(58) Field of Classification Search
CPC ......... H03M 7/20; H03M 7/001; H03M 7/04; H03M 7/30; H03M 7/00
USPC ..................................................... 341/55, 95
See application file for complete search history.

(56) References Cited

U.S. PATENT DOCUMENTS

| | | | | |
|---|---|---|---|---|
| 6,311,239 | B1 * | 10/2001 | Matthews ................. | G06F 5/00 370/471 |
| 6,535,151 | B2 * | 3/2003 | Coene .................... | H03M 5/145 341/102 |
| 6,771,195 | B2 * | 8/2004 | Kahlmann ............. | H03M 13/05 341/102 |
| 7,397,399 | B2 * | 7/2008 | Thebault ................ | H03M 7/24 341/50 |
| 7,580,564 | B2 * | 8/2009 | Bailey ..................... | H04N 1/60 382/166 |

\* cited by examiner

*Primary Examiner* — Brian Young
(74) *Attorney, Agent, or Firm* — Lerner, David, Littenberg, Krumholz & Mentlik, LLP

(57) ABSTRACT

Saturation refers to the process of limiting the value of a signal to the maximum or minimum value that can be represented by a given fixed bit width representation of the signal. In fixed bit width implementations of signal processing algorithms, saturation of a signal is an important operation when the output value of a processing step exceeds the number of bits available to represent it. Saturation may be required after each elementary signal processing step. Many signal processing algorithms are often implemented in hardware. Therefore, it is important to have an efficient method that utilizes least amount of hardware to implement the saturation operation. A method and apparatus are disclosed that implement saturation function using reduced hardware requirements and reduced power consumption.

20 Claims, 7 Drawing Sheets

FIG. 4

| $c_1$ | $c_0$ | Output selection |
|---|---|---|
| 0 | 0 | Lowest M-bits of input |
| 0 | 1 | Positive saturation value |
| 1 | 0 | Negative saturation value |
| 1 | 1 | Invalid |

METHOD AND APPARATUS FOR SIGNAL SATURATION

BACKGROUND

Most signals of practical interest such as speech, radar, sonar, communication, audio, and video are analog. To process analog signals by digital means it is necessary to convert them into digital form, i.e., into a sequence of numbers having finite precision. A fixed-point number representation is a number that has a fixed number of digits before and after the radix point. The term radix point is similar to the decimal point but it is a generalized term to refer to any numbering base such as binary, octal, hexadecimal, etc. Fixed-point number representation is simpler compared to the more complicated and more computationally intensive floating-point number representation.

Fixed-point numbers are useful for representing integer as well as fractional values, usually in base-2 (binary) for digital implementation. The maximum value of a fixed-point number is simply the largest value that can be represented by the number of bits used to express the fixed-point number. If a 2's complement signed representation is used, the largest positive value that can be represented by an N-bit number is $2^{N-1}-1$ and the largest negative value that can be represented by an N-bit number is $-2^{N-1}$. Note that the above explanation considered the N-bit number to be an integer. If some of the bits are used for a representing fractional part of the value then the largest value that can be represented will be smaller in magnitude but it will have additional precision corresponding to the fractional bits. Specifically, let $N=N_I+N_F$ where $N_I$ represents the number of bits used for integer part and $N_F$ represents the number of bits used for representing fractional part. With this representation, the largest positive number that can be expressed is $2^{N_I-1}-2^{-N_F}$ and the largest negative number that can be expressed is $-2^{N_I}$.

In fixed-point arithmetic when numbers are added, subtracted, multiplied, divided, or in general manipulated as part of the processing, the result of such processing may have a larger value than the largest values of the input operands. This increased value of the number may require additional bits for representation and storage. In some cases, it may be acceptable to increase the number of bits to represent the output of a processing stage. In other cases, it may be desirable to limit the largest positive or negative value that the output of a processing stage may take. If a signal is limited to a certain number of bits and not allowed to take the full value it may have taken without the limiting, the signal may be distorted. The process of limiting the value of a signal to a certain number of bits is referred herein as saturation. When a signal is saturated, distortion may be caused. In some applications, it may be desirable to accept some amount of saturation and its concomitant distortion in order to limit the bit-width and to reduce the complexity of the processing. Saturation is different from other commonly used numerical approximations such as rounding and truncation where the additional precision of a signal is discarded. The rounding and truncation operations are applicable to every single value of a signal whereas saturation is effective only when the value of a signal exceeds the maximum or minimum value that can be represented within a chosen numerical precision.

Consider a signal s, which is represented by bit-width of N bits. Furthermore, let the signal s be represented in 2's complement format where the Most Significant Bit (MSB) is a sign bit. Let the value of the signal s be expressed by a number which is represented by a sequence of bits $b_{N-1}$, $b_{N-2}$, $b_{N-3}$, ..., $b_2$, $b_1$, $b_0$. Let M denote the bit-width required after saturating the signal s.

Normally a comparator may be required to implement the limiting function. A comparator may compare the largest value that can be represented by an M-bit number with the input N-bit input signal. If the value of the N-bit input signal s is larger than the largest positive number that can be expressed by an M-bit representation, then the largest positive M-bit value is output. Similarly, if the value of the N-bit input signal s is smaller than the largest negative number that can be expressed by an M-bit representation, then the largest negative M-bit value is output. Otherwise, the original value of the input N-bit number is output but in M-bit representation. For example, consider the case where a signal represented with 8-bits is to be saturated to 5-bits, both in 2's complement format. The maximum positive and maximum negative values for a 5-bit 2's complement number are +15 and -16 respectively. If the 8-bit input signal value is, for example, 123, it will be saturated to +15. If the 8-bit input signal value is, for example, -115, it will be saturated to -16. If the 8-bit input signal value is, for example, 13, it will be left as is, i.e., the output of the saturation logic will be 13. If the 8-bit input signal value is, for example, -14, it will be left as is, i.e., the output of the saturation logic will be -14.

Let MAX_VAL denote the largest positive value that can be represented by an M-bit binary number in 2's complement format. Let MIN_VAL denote the largest negative value that can be represented by an M-bit binary number in 2's complement format. The limiting operation is illustrated in pseudo code below for getting a saturated output signal r from an input signal s.

```
If (s > 0)                  // positive number?
{
    If (s > MAX_VAL)
        r = MAX_VAL
    Else
        r = s
}
Else                        // negative number
{
    If (s < MIN_VAL)
        r = MIN_VAL
    Else
        r = s
}
```

In hardware, the logic illustrated in the pseudo code may be implemented as shown in FIG. 1. The N-bit input signal s is compared with the MAX_VAL and MIN_VAL values in parallel using the N-bit comparators C1 and C2 respectively. The results of the comparison are used to select between the N-bit input signal s and the MAX_VAL in the N-bit multiplexer M1 and between input signal s and the MIN_VAL in the N-bit multiplexer M2. Finally, the selection between the output of multiplexers M1 and M2 is done in the M-bit multiplexer M3 using the sign bit of the input signal as the select line. In this example implementation, there are two N-bit comparators, two N-bit multiplexers and one M-bit multiplexer. The logic depth is three stages as the final output appears after the input goes three stages of logic units.

Performing saturation is a required operation in many digital signal processing circuits to keep the bit-width of the signals from continuing to grow as the signals go through multiple stages of processing. In some cases, the circuitry required to perform saturation may be more complex than the actual arithmetic being implemented in a processing block.

For example, when adding two N-bit numbers, the output bit-width may be N+1 bits. If the output is to be limited to N-bits, a saturation circuit similar to the one shown in FIG. may be required. In this case, the addition operation requires a single N-bit adder but the saturation circuit requires two comparators and three multiplexers. The added complexity of the saturation circuit may also increase the power consumption of the circuit. Therefore, a more efficient technique is required for implementing saturation logic. A method and apparatus are disclosed that enable a fast and hardware efficient saturation circuit. This may lead to reduced power consumption and reduced silicon area.

SUMMARY

In accordance with an aspect of the present invention, a method for converting an N bit representation of a signal to an M bit representation of the signal, wherein M<N, may include: controlling, by a processing device, a logical OR operation on N−M most significant bits of the N bit representation, in which the N−M most significant bits are bits in sequence of decreasing significance starting from a bit next to the most significant bit of the N bit representation, to obtain an OR operation output; a logical AND operation on the N−M most significant bits, to obtain an AND operation output; a first multiplexing operation of a first bit input which is a largest positive value of the M bit representation and a second bit input of the M least significant bits of the N bit representation, using the OR operation output to select the first bit input or the second bit input, to obtain a first multiplexer M bit output; a second multiplexing operation of a third bit input which is a largest negative value of the M bit representation and a fourth bit input of the M least significant bits of the N bit representation, using the AND operation output to select the third bit input or the fourth bit input, to obtain a second multiplexer M bit output; and a third multiplexing operation of the first multiplexer M bit output and the second multiplexer M bit output, using the most significant bit of the N bit representation to select the first multiplexer M bit output or the second multiplexer M bit output for output as a third multiplexer M bit output which is the M bit representation of the signal.

In one alternative, when the most significant bit of the N bit representation is positive, the first multiplexer M bit output may be selected for the third multiplexer M bit output, and wherein, when the most significant bit of the N bit representation is negative, the second multiplexer M bit output may be selected for the third multiplexer M bit output.

In one alternative, the N bit representation may be a fixed point number representation of an integer value, a fractional value or a combination of an integer value and a fractional value.

In accordance with an aspect of the present invention, a method for converting an N bit representation of a signal to an M bit representation of the signal, wherein M<N, may include controlling, by a processing device, (I) a logical AND operation on N−M most significant bits of the N bit representation, in which the N−M most significant bits are bits in sequence of decreasing significance starting from a bit next to the most significant bit of the N bit representation, to obtain an AND operation output, inverting the AND operation output to obtain an inverted AND operation output, and a second logical AND operation on the inverted AND operation output and the most significant bit of the N bit representation, to obtain a second AND operation output; (II) a logical OR operation on the N−M most significant bits, to obtain an OR operation output, inverting the most significant bit of the N bit representation to obtain an inverted most significant bit, and a third logical AND operation on the OR operation output and the inverted most significant bit of the N bit representation, to obtain a third AND operation output; and (III) a multiplexing operation of a first bit input which is a largest positive value of the M bit representation, a second bit input which is a largest negative value of the M bit representation and a third bit input of the M least significant bits of the N bit representation, using the second AND operation output and the third AND operation output to select one of the first, second and third bit inputs for outputting as an M bit multiplexer output which is the M bit representation of the signal.

In one alternative, the largest positive value of the M bit representation may be selected for the M bit multiplexer output when the second AND operation output indicates positive saturation for the converting; the largest negative value of the M bit representation may be selected for the M bit multiplexer output when the third AND operation output indicates negative saturation for the converting; and the M least significant bits of the N bit representation may be selected for the M bit output when the second AND operation output does not indicate positive saturation for the converting and the third AND operation output does not indicate negative saturation for the converting.

In one alternative, the second AND operation output does not indicate positive saturation for the converting at a same time that the third AND operation output indicates negative saturation for the converting.

In one alternative, the N bit representation may be a fixed point number representation of an integer value, a fractional value or a combination of an integer value and a fractional value.

In accordance with an aspect of the present invention, an apparatus for converting an N bit representation of a signal to an M bit representation of the signal, wherein M<N, may include circuitry including: a logic OR gate for performing an OR operation on N−M most significant bits of the N bit representation, in which the N−M most significant bits are bits in sequence of decreasing significance starting from a bit next to the most significant bit of the N bit representation, to obtain an OR operation output; a logical AND gate for performing an AND operation on the N−M most significant bits, to obtain an AND operation output; a first multiplexer for performing a multiplexing operation of a first bit input which is a largest positive value of the M bit representation and a second bit input of the M least significant bits of the N bit representation, using the OR operation output to select the first bit input or the second bit input, to obtain a first multiplexer M bit output; a second multiplexer for performing a multiplexing operation of a third bit input which is a largest negative value of the M bit representation and a fourth bit input of the M least significant bits of the N bit representation, using the AND operation output to select the third bit input or the fourth bit input, to obtain a second multiplexer M bit output; and a third multiplexer for performing a multiplexing operation of the first multiplexer M bit output and the second multiplexer M bit output, using the most significant bit of the N bit representation to select the first multiplexer M bit output or the second multiplexer M bit output for output as a third multiplexer M bit output which is the M bit representation of the signal.

In one alternative of the apparatus, when the most significant bit of the N bit representation is positive, the first multiplexer M bit output may be selected for the third multiplexer M bit output, and wherein, when the most significant bit of the N bit representation is negative, the second multiplexer M bit output may be selected for the third multiplexer M bit output.

In one alternative of the apparatus, the N bit representation may be a fixed point number representation of an integer value, a fractional value or a combination of an integer value and a fractional value.

In accordance with an aspect of the present invention, an apparatus for converting an N bit representation of a signal to an M bit representation of the signal, wherein M<N, may include circuitry including: (I) a logical AND gate for performing an AND operation on N−M most significant bits of the N bit representation, in which the N−M most significant bits are bits in sequence of decreasing significance starting from a bit next to the most significant bit of the N bit representation, to obtain an AND operation output, an inverter for inverting the AND operation output to obtain an inverted AND operation output, and a second logical AND gate for performing an AND operation on the inverted AND operation output and the most significant bit of the N bit representation, to obtain a second AND operation output; (II) a logical OR gate for performing an OR operation on the N−M most significant bits, to obtain an OR operation output, a second inverter for inverting the most significant bit of the N bit representation to obtain an inverted most significant bit, and a third logical AND gate for performing an AND operation on the OR operation output and the inverted most significant bit of the N bit representation, to obtain a third AND operation output; and (III) a multiplexer for performing a multiplexing operation of a first bit input which is a largest positive value of the M bit representation, a second bit input which is a largest negative value of the M bit representation and a third bit input of the M least significant bits of the N bit representation, using the second AND operation output and the third AND operation output to select one of the first, second and third bit inputs for outputting as an M bit multiplexer output which is the M bit representation of the signal.

In one alternative of the apparatus, the largest positive value of the M bit representation may be selected for the M bit multiplexer output when the second AND operation output indicates positive saturation for the converting; the largest negative value of the M bit representation may be selected for the M bit multiplexer output when the third AND operation output indicates negative saturation for the converting; and the M least significant bits of the N bit representation may be selected for the M bit output when the second AND operation output does not indicate positive saturation for the converting and the third AND operation output does not indicate negative saturation for the converting.

In one alternative of the apparatus, the second AND operation output does not indicate positive saturation for the converting at a same time that the third AND operation output indicates negative saturation for the converting.

In one alternative of the apparatus, the N bit representation may be a fixed point number representation of an integer value, a fractional value or a combination of an integer value and a fractional value.

In accordance with an aspect of the present invention, a communication device may include circuitry configured to receive an N bit representation of a signal. The circuitry may be configured to convert the N bit representation of the signal to an M bit representation of the signal, wherein M<N, and include: a logic OR gate for performing an OR operation on N−M most significant bits of the N bit representation, in which the N−M most significant bits are bits in sequence of decreasing significance starting from a bit next to the most significant bit of the N bit representation, to obtain an OR operation output; a logical AND gate for performing an AND operation on the N−M most significant bits, to obtain an AND operation output; a first multiplexer for performing a multiplexing operation of a first bit input which is a largest positive value of the M bit representation and a second bit input of the M least significant bits of the N bit representation, using the OR operation output to select the first bit input or the second bit input, to obtain a first multiplexer M bit output; a second multiplexer for performing a multiplexing operation of a third bit input which is a largest negative value of the M bit representation and a fourth bit input of the M least significant bits of the N bit representation, using the AND operation output to select the third bit input or the fourth bit input, to obtain a second multiplexer M bit output; and a third multiplexer for performing a multiplexing operation of the first multiplexer M bit output and the second multiplexer M bit output, using the most significant bit of the N bit representation to select the first multiplexer M bit output or the second multiplexer M bit output for output as a third multiplexer M bit output which is the M bit representation of the signal.

In one alternative of the communication device, when the most significant bit of the N bit representation is positive, the first multiplexer M bit output may be selected for the third multiplexer M bit output, and when the most significant bit of the N bit representation is negative, the second multiplexer M bit output may be selected for the third multiplexer M bit output.

In one alternative of the communication device, the N bit representation may be a fixed point number representation of an integer value, a fractional value or a combination of an integer value and a fractional value.

In accordance with an aspect of the present invention, a communication device may include circuitry configured to receive an N bit representation of a signal. The circuitry may be configured to convert the N bit representation of the signal to an M bit representation of the signal, wherein M<N, and include: (I) a logical AND gate for performing an AND operation on N−M most significant bits of the N bit representation, in which the N−M most significant bits are bits in sequence of decreasing significance starting from a bit next to the most significant bit of the N bit representation, to obtain an AND operation output, an inverter for inverting the AND operation output to obtain an inverted AND operation output, and a second logical AND gate for performing an AND operation on the inverted AND operation output and the most significant bit of the N bit representation, to obtain a second AND operation output; (II) a logical OR gate for performing an OR operation on the N−M most significant bits, to obtain an OR operation output, a second inverter for inverting the most significant bit of the N bit representation to obtain an inverted most significant bit, and a third logical AND gate for performing an AND operation on the OR operation output and the inverted most significant bit of the N bit representation, to obtain a third AND operation output; and (III) a multiplexer for performing a multiplexing operation of a first bit input which is a largest positive value of the M bit representation, a second bit input which is a largest negative value of the M bit representation and a third bit input of the M least significant bits of the N bit representation, using the second AND operation output and the third AND operation output to select one of the first, second and third bit inputs for outputting as an M bit multiplexer output which is the M bit representation of the signal.

In one alternative of the communication device, the largest positive value of the M bit representation may be selected for the M bit multiplexer output when the second AND operation output indicates positive saturation for the converting; the largest negative value of the M bit representation may be selected for the M bit multiplexer output when the third AND operation output indicates negative saturation for the converting; and the M least significant bits of the N bit representation may be selected for the M bit output when the second AND operation output does not indicate positive saturation for the converting and the third AND operation output does not indicate negative saturation for the converting.

In one alternative of the communication device, the N bit representation may be a fixed point number representation of an integer value, a fractional value or a combination of an integer value and a fractional value.

BRIEF DESCRIPTION OF THE DRAWINGS

FIG. 4 illustrates the truth table for the multiplexer in an example alternate saturation circuit according to the aspects of the present invention.

DETAILED DESCRIPTION

Figure 1:
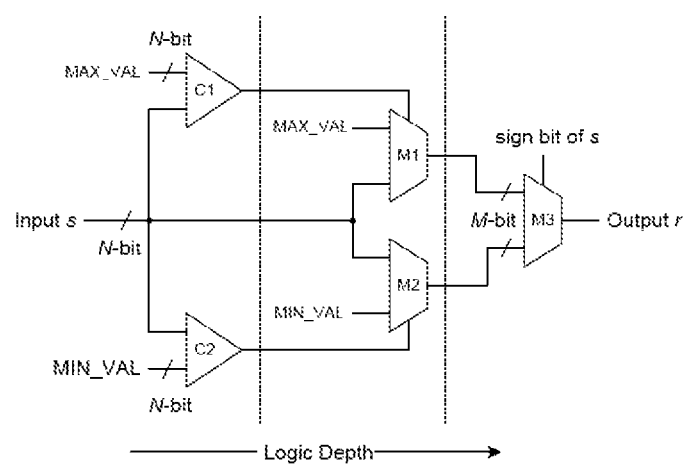
FIG. 1 illustrates an example conventional saturation circuit.

The foregoing aspects, features and advantages of the present invention will be further appreciated when considered with reference to the following description of exemplary embodiments and accompanying drawings, wherein like reference numerals represent like elements. In describing the exemplary embodiments of the aspects of the invention illustrated in the appended drawings, specific terminology will be used for the sake of clarity. However, the aspects of the invention are not intended to be limited to the specific terms used.

Consider an N=8-bit signal s represented in 2's complement format. Suppose this signal is to be saturated to M=5-bit value in the range of $2^{M-1}-1=+15$ to $-2^{M-1}=-16$. As per the definition of 2's complement representation of a number, the MSB represents the sign bit and its value is '0' for positive numbers and '1' for negative numbers. If the value of the 8-bit input s is positive, then any bit set in the bit positions 6, 5, and 4 indicates that the number is greater than 15 (the value 15 is represented in 8-bit 2's complement format as 00001111). If the value of the 8-bit input s is negative, then any bit reset (set to binary zero) in the bit positions 6, 5, and 4 indicates that the number is less than −16 (the value −16 is represented in 8-bit 2's complement format as 11110000). In general, for an N-bit number to be saturated to M bits, the N−M+1 most significant bits including the sign bit may be used to perform saturation.

The logic for the example of N=8-bit input signal being saturated to M=5-bits is illustrated in the pseudo code below according to the aspects of the present invention.

```
If (b7 == 0)                        // positive number?
{
    If (OR (b6, b5, b4) == 1)       // 3-input OR gate is used
    {
        Number is greater than +15
        Hence limit this number to +15
    }
    Else
    {
        Number is less than +15
        Retain the original value
    }
}
Else
{
    If (AND (b6, b5, b4) == 0)      // 3-input AND gate is used.
    {
        Number is less than −16
        Hence limit this number to −16
    }
    Else
    {
        Number is greater than −16
        Retain the original value
    }
}
```

Figure 2:
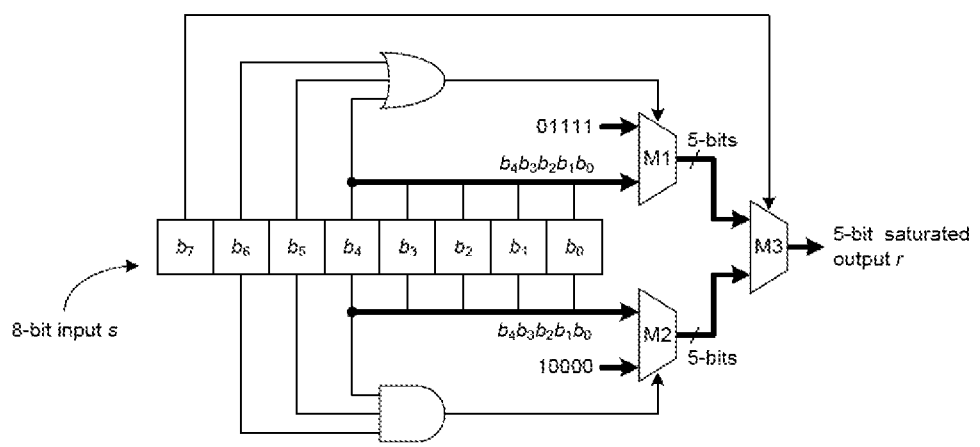
FIG. 2 illustrates an example saturation circuit according to the aspects of the present invention.

According to the aspects of the present invention, the saturation logic may be implemented without the use of comparators as shown in FIG. 2. According to the aspect of the present invention, to saturate a signal from N-bit representation to an M-bit representation, an (N−M)-input OR gate, an (N−M)-input AND gate and three M-bit 2-to-1 multiplexers may be used.

This method may be more efficient compared to conventional methods that use comparators to saturate a signal towards positive or negative maximum value that can be represented in a given bit-width format.

Figure 3:
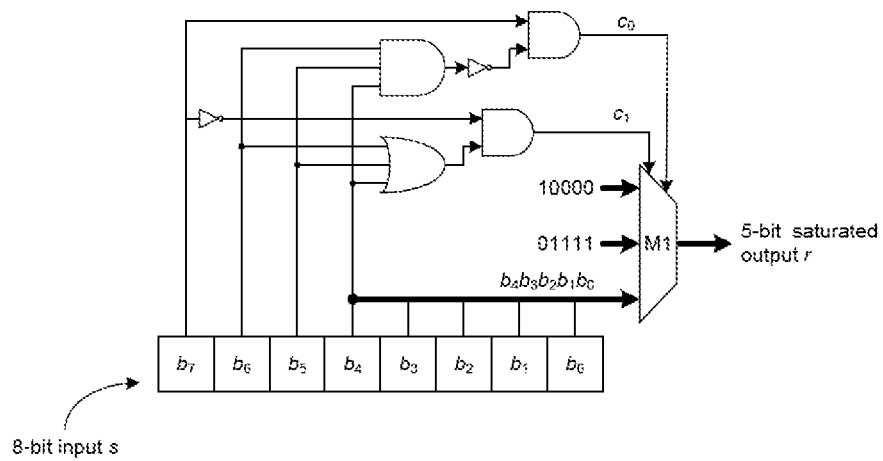
FIG. 3 illustrates an example of an alternate saturation circuit according to the aspects of the present invention.

According to another aspect of the invention, the example saturation circuit may be either implemented using three M-bit 2-to-1 multiplexers or a single M-bit 3-to-1 multiplexer and some additional logic as shown in FIG. 3. The control signal $c_0$ may be generated by performing the logical AND of the bits $b_6$, $b_5$, and $b_4$, inverting the output of the AND gate and then performing logical AND with the sign bit. This control signal may be used to indicate that a positive saturation is required and the bit string corresponding to the positive saturation is selected and output by the multiplexer M1. According to the aspects of the present invention, the control signal $c_1$ may be generated by performing the logical OR of the bits $b_6$, $b_5$, and $b_4$, and then performing logical AND with the inverted sign bit. This control signal may be used to indicate that a negative saturation is required and the bit string corresponding to the negative saturation is selected and output by the multiplexer M1. When neither of the two control signals $c_0$ and $c_1$ is logic high, the five Least Significant Bits (LSBs) are selected as output by the multiplexer M1. By definition of the control signals above, both control signals $c_0$ and $c_1$ cannot be high at the same time and therefore that logic combination is invalid. The truth table for the multiplexer is as shown in FIG. 4. Generalizing the processing in the above example, according to the aspects of the present invention, the control signal $c_0$ may be generated by performing the logical AND of the N−M most significant bits excluding the sign bit, inverting the output of the AND gate and then performing logical AND with the sign bit. The control signal $c_0$ may be used to indicate whether a positive saturation is required. According to the aspects of the present invention, the control signal $c_1$ may be generated by performing the logical OR of the bits N−M most significant bits excluding the sign bit, and then performing logical AND with the inverted sign bit. The control signal $c_1$ may be used to indicate whether a negative saturation is required. According to the aspects of the present invention both the control signals $c_0$ and $c_1$ may not be high at the same time.

Aspects of the present invention may be implemented in any application where fixed point processing is used. The method may be applicable to any fixed point representation for integer values, fractional values or integer plus fractional values. The method may be also applicable to the cases where input operands of a processing stage may have different bit widths. Aspects of the present method may be applicable to speech, radar, sonar, communication, audio, video, or any other type of signal processing. Aspects of the present invention may be applicable in general purpose processors such as microprocessors, microcontrollers, Digital Signal Processors (DSPs), etc. Aspects of the present invention may be used for any arithmetic operation such as addition, subtraction, multiplication, division, etc. Aspects of the present inventions may be applicable to systems with real signals, complex signals, multi-dimensional real or complex signals, etc.

By way of example only, the above described method may be implemented in a user device such as a wireless mobile station (MS).

Figure 5:
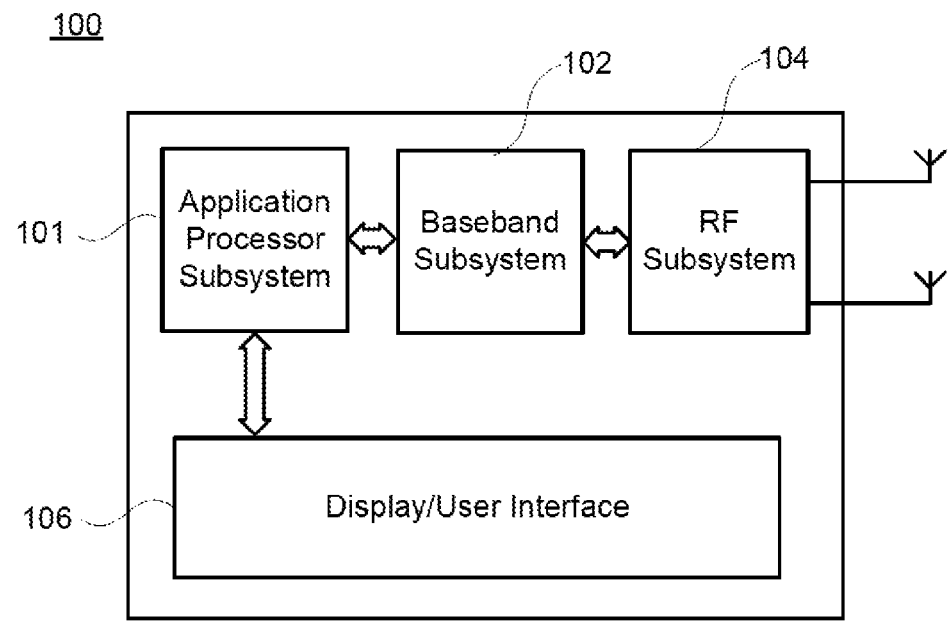
FIG. 5 illustrates a wireless mobile station diagram, which may be employed with aspects of the invention described herein.

As shown in FIG. 5, MS 100 may include an application processor subsystem 101, baseband subsystem 102 and a radio frequency (RF) subsystem 104 for use with a wireless communication network. A display/user interface 106 provides information to and receives input from the user. By way of example, the user interface may include one or more actuators, a speaker and a microphone. In some mobile devices, certain combination of the application processor subsystem 101, the baseband subsystem 102 and the RF subsystem 104 are all integrated as one integrated chip.

Figure 6:
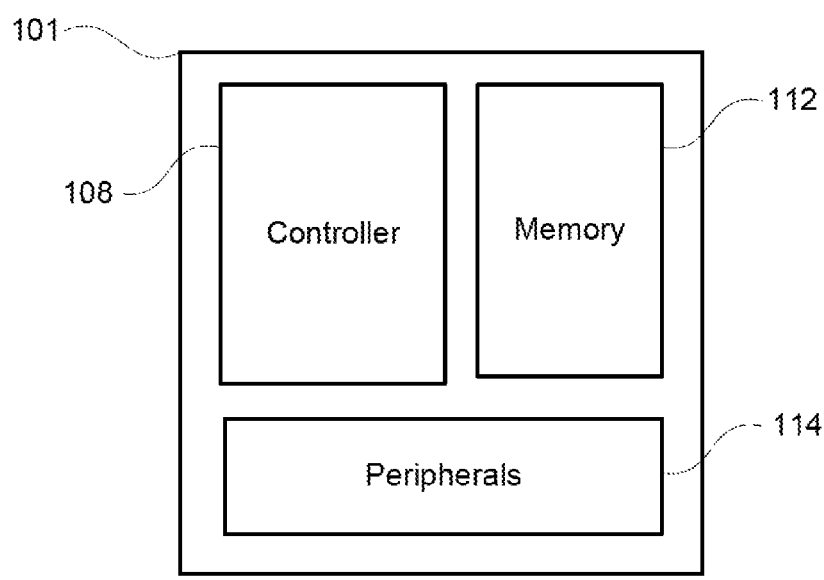
FIG. 6 illustrates an application processor subsystem for a wireless mobile station, which may be employed with aspects of the invention described herein.
Figure 7:
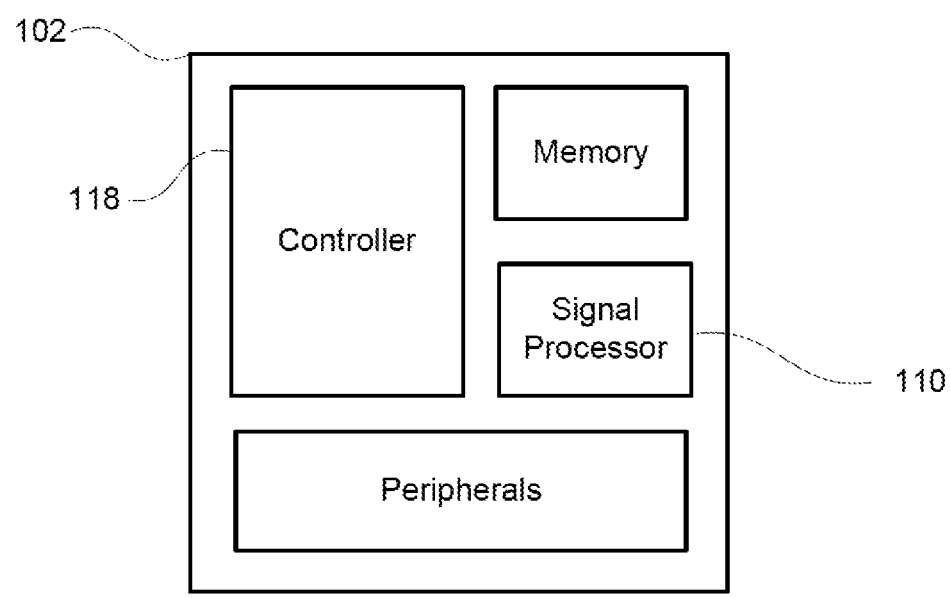
FIG. 7 illustrates a baseband subsystem for a wireless mobile station, which may be employed with aspects of the invention described herein.
Figure 8:
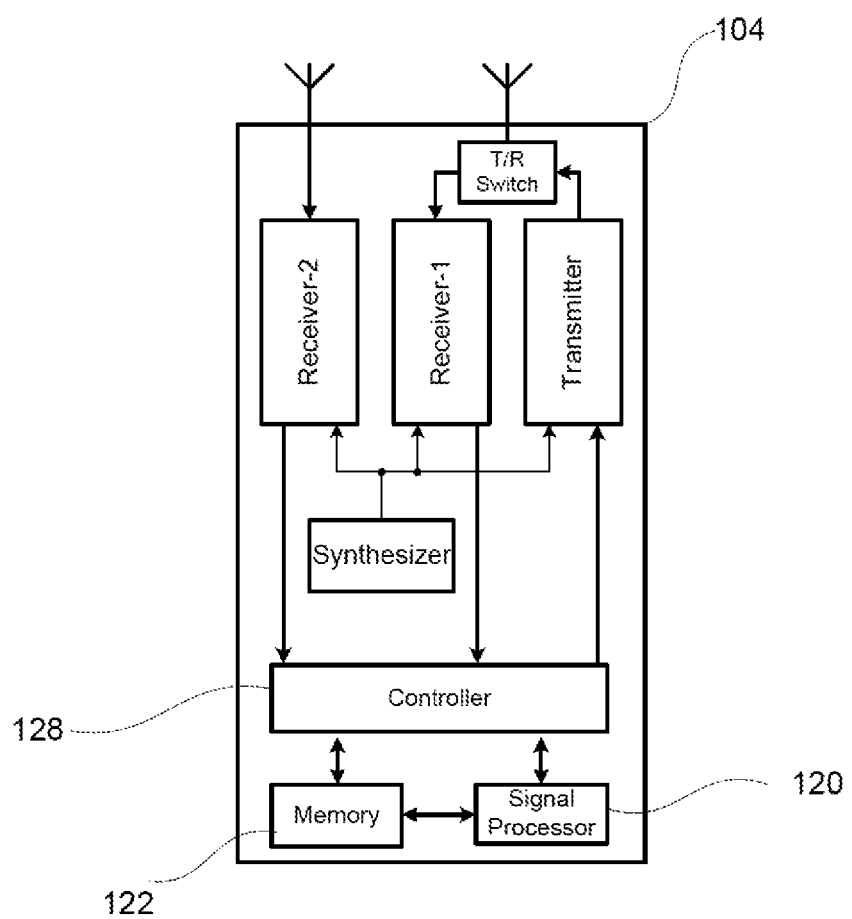
FIG. 8 illustrates an RF subsystem for a wireless mobile station, which may be employed with aspects of the invention described herein.

The application processor subsystem 101 as shown in FIG. 6 may include a controller 108 such as a microcontroller, another processor or other circuitry. The baseband subsystem 102 as shown in FIG. 7 may include a controller 118 such as a microcontroller or other processor. The RF subsystem 104 as shown in FIG. 8 may include a controller 128 such as a microcontroller, another processor or other circuitry. The controller 108 desirably handles overall operation of the MS 100. This may be done by any combination of hardware, software and firmware running on the controller 108. Such a combination of hardware, software and firmware may embody any methods in accordance with the aspects of the present invention.

In FIG. 6 the peripherals 114 such as a full or partial keyboard, video or still image display, audio interface, etc may be employed and managed through the controller 108.

Aspects of the present invention may be implemented in firmware of the controller 108 of the application processor in FIG. 6 and/or the controller 118 of the baseband subsystem as shown in FIG. 5. In another alternative, aspects of the present invention may also be implemented as a combination of firmware and hardware of the application processor subsystem 101 and/or the baseband subsystem 102. For instance, signal processing functionality of any or all of the FIG. 7 may be implemented in firmware and/or software, which is executed by the system hardware. It may be part of the baseband subsystem, the receiver subsystem or be associated with both subsystems. In one example, the controller 118 and/or the signal processor 110 may include or control the protocol entity circuitry. The software may reside in internal or external memory and any data may be stored in such memory. The hardware may be an application specific integrated circuit (ASIC), field programmable gate array (FPGA), discrete logic components or any combination of such devices. The terms controller and processor are used interchangeably herein.

The consumer electronics devices that may use the aspects of the invention may include smartphones, tablets, laptops, gaming consoles, cameras, video camcorders, TV, car entertainment systems, etc.

Although aspects of the invention herein have been described with reference to particular embodiments, it is to be understood that these embodiments are merely illustrative of the principles and applications of the aspects of the present invention. It is therefore to be understood that numerous modifications may be made to the illustrative embodiments and that other arrangements may be devised without departing from the spirit and scope of the aspects of the present invention as defined by the appended claims. Aspects of each embodiment may be employed in the other embodiments described herein.

The invention claimed is:

1. A method for converting an N bit representation of a signal to an M bit representation of the signal, wherein M<N, the method comprising:
   controlling, by a processing device,
      a logical OR operation on N−M most significant bits of the N bit representation, in which the N−M most significant bits are bits in sequence of decreasing significance starting from a bit next to the most significant bit of the N bit representation, to obtain an OR operation output;
      a logical AND operation on the N−M most significant bits, to obtain an AND operation output;
      a first multiplexing operation of a first bit input which is a largest positive value of the M bit representation and a second bit input of the M least significant bits of the N bit representation, using the OR operation output to select the first bit input or the second bit input, to obtain a first multiplexer M bit output;
      a second multiplexing operation of a third bit input which is a largest negative value of the M bit representation and a fourth bit input of the M least significant bits of the N bit representation, using the AND operation output to select the third bit input or the fourth bit input, to obtain a second multiplexer M bit output; and
      a third multiplexing operation of the first multiplexer M bit output and the second multiplexer M bit output, using the most significant bit of the N bit representation to select the first multiplexer M bit output or the second multiplexer M bit output for output as a third multiplexer M bit output which is the M bit representation of the signal.

2. The method of claim 1,
   wherein, when the most significant bit of the N bit representation is positive, the first multiplexer M bit output is selected for the third multiplexer M bit output, and
   wherein, when the most significant bit of the N bit representation is negative, the second multiplexer M bit output is selected for the third multiplexer M bit output.

3. The method of claim 1,
   wherein the N bit representation is a fixed point number representation of an integer value, a fractional value or a combination of an integer value and a fractional value.

4. A method for converting an N bit representation of a signal to an M bit representation of the signal, wherein M<N, the method comprising:

controlling, by a processing device,
(I) a logical AND operation on N–M most significant bits of the N bit representation, in which the N–M most significant bits are bits in sequence of decreasing significance starting from a bit next to the most significant bit of the N bit representation, to obtain an AND operation output,
inverting the AND operation output to obtain an inverted AND operation output, and
a second logical AND operation on the inverted AND operation output and the most significant bit of the N bit representation, to obtain a second AND operation output; (II) a logical OR operation on the N–M most significant bits, to obtain an OR operation output,
inverting the most significant bit of the N bit representation to obtain an inverted most significant bit, and
a third logical AND operation on the OR operation output and the inverted most significant bit of the N bit representation, to obtain a third AND operation output; and
(III) a multiplexing operation of a first bit input which is a largest positive value of the M bit representation, a second bit input which is a largest negative value of the M bit representation and a third bit input of the M least significant bits of the N bit representation, using the second AND operation output and the third AND operation output to select one of the first, second and third bit inputs for outputting as an M bit multiplexer output which is the M bit representation of the signal.

5. The method of claim 4,
wherein the largest positive value of the M bit representation is selected for the M bit multiplexer output when the second AND operation output indicates positive saturation for the converting;
wherein the largest negative value of the M bit representation is selected for the M bit multiplexer output when the third AND operation output indicates negative saturation for the converting; and
wherein the M least significant bits of the N bit representation is selected for the M bit output when the second AND operation output does not indicate positive saturation for the converting and the third AND operation output does not indicate negative saturation for the converting.

6. The method of claim 5, wherein the second AND operation output does not indicate positive saturation for the converting at a same time that the third AND operation output indicates negative saturation for the converting.

7. The method of claim 3, wherein the N bit representation is a fixed point number representation of an integer value, a fractional value or a combination of an integer value and a fractional value.

8. An apparatus for converting an N bit representation of a signal to an M bit representation of the signal, wherein M<N, the apparatus comprising:
circuitry including
a logic OR gate for performing an OR operation on N–M most significant bits of the N bit representation, in which the N–M most significant bits are bits in sequence of decreasing significance starting from a bit next to the most significant bit of the N bit representation, to obtain an OR operation output;
a logical AND gate for performing an AND operation on the N–M most significant bits, to obtain an AND operation output;
a first multiplexer for performing a multiplexing operation of a first bit input which is a largest positive value of the M bit representation and a second bit input of the M least significant bits of the N bit representation, using the OR operation output to select the first bit input or the second bit input, to obtain a first multiplexer M bit output;
a second multiplexer for performing a multiplexing operation of a third bit input which is a largest negative value of the M bit representation and a fourth bit input of the M least significant bits of the N bit representation, using the AND operation output to select the third bit input or the fourth bit input, to obtain a second multiplexer M bit output; and
a third multiplexer for performing a multiplexing operation of the first multiplexer M bit output and the second multiplexer M bit output, using the most significant bit of the N bit representation to select the first multiplexer M bit output or the second multiplexer M bit output for output as a third multiplexer M bit output which is the M bit representation of the signal.

9. The apparatus of claim 8,
wherein, when the most significant bit of the N bit representation is positive, the first multiplexer M bit output is selected for the third multiplexer M bit output, and
wherein, when the most significant bit of the N bit representation is negative, the second multiplexer M bit output is selected for the third multiplexer M bit output.

10. The apparatus of claim 8,
wherein the N bit representation is a fixed point number representation of an integer value, a fractional value or a combination of an integer value and a fractional value.

11. An apparatus for converting an N bit representation of a signal to an M bit representation of the signal, wherein M<N, the apparatus comprising:
circuitry including
(I) a logical AND gate for performing an AND operation on N–M most significant bits of the N bit representation, in which the N–M most significant bits are bits in sequence of decreasing significance starting from a bit next to the most significant bit of the N bit representation, to obtain an AND operation output,
an inverter for inverting the AND operation output to obtain an inverted AND operation output, and
a second logical AND gate for performing an AND operation on the inverted AND operation output and the most significant bit of the N bit representation, to obtain a second AND operation output;
(II) a logical OR gate for performing an OR operation on the N–M most significant bits, to obtain an OR operation output,
a second inverter for inverting the most significant bit of the N bit representation to obtain an inverted most significant bit, and
a third logical AND gate for performing an AND operation on the OR operation output and the inverted most significant bit of the N bit representation, to obtain a third AND operation output; and
(III) a multiplexer for performing a multiplexing operation of a first bit input which is a largest positive value of the M bit representation, a second bit input which is a largest negative value of the M bit representation and a third bit input of the M least significant bits of the N bit representation, using the second AND operation output and the third AND operation output to select one of the first, second and third bit inputs for outputting as an M bit multiplexer output which is the M bit representation of the signal.

12. The apparatus of claim 11,
wherein the largest positive value of the M bit representation is selected for the M bit multiplexer output when the second AND operation output indicates positive saturation for the converting;
wherein the largest negative value of the M bit representation is selected for the M bit multiplexer output when the third AND operation output indicates negative saturation for the converting; and
wherein the M least significant bits of the N bit representation is selected for the M bit output when the second AND operation output does not indicate positive saturation for the converting and the third AND operation output does not indicate negative saturation for the converting.

13. The apparatus of claim 12, wherein the second AND operation output does not indicate positive saturation for the converting at a same time that the third AND operation output indicates negative saturation for the converting.

14. The apparatus of claim 11, wherein the N bit representation is a fixed point number representation of an integer value, a fractional value or a combination of an integer value and a fractional value.

15. A communication device comprising:
circuitry configured to receive an N bit representation of a signal,
wherein the circuitry is configured to convert the N bit representation of the signal to an M bit representation of the signal, wherein M<N,
wherein the circuitry includes
a logic OR gate for performing an OR operation on N−M most significant bits of the N bit representation, in which the N−M most significant bits are bits in sequence of decreasing significance starting from a bit next to the most significant bit of the N bit representation, to obtain an OR operation output;
a logical AND gate for performing an AND operation on the N−M most significant bits, to obtain an AND operation output;
a first multiplexer for performing a multiplexing operation of a first bit input which is a largest positive value of the M bit representation and a second bit input of the M least significant bits of the N bit representation, using the OR operation output to select the first bit input or the second bit input, to obtain a first multiplexer M bit output;
a second multiplexer for performing a multiplexing operation of a third bit input which is a largest negative value of the M bit representation and a fourth bit input of the M least significant bits of the N bit representation, using the AND operation output to select the third bit input or the fourth bit input, to obtain a second multiplexer M bit output; and
a third multiplexer for performing a multiplexing operation of the first multiplexer M bit output and the second multiplexer M bit output, using the most significant bit of the N bit representation to select the first multiplexer M bit output or the second multiplexer M bit output for output as a third multiplexer M bit output which is the M bit representation of the signal.

16. The communication device of claim 15,
wherein, when the most significant bit of the N bit representation is positive, the first multiplexer M bit output is selected for the third multiplexer M bit output, and
wherein, when the most significant bit of the N bit representation is negative, the second multiplexer M bit output is selected for the third multiplexer M bit output.

17. The communication device of claim 15,
wherein the N bit representation is a fixed point number representation of an integer value, a fractional value or a combination of an integer value and a fractional value.

18. An communication device comprising:
circuitry configured to receive an N bit representation of a signal,
wherein the circuitry is configured to convert the N bit representation of the signal to an M bit representation of the signal, wherein M<N,
wherein the circuitry includes
(I) a logical AND gate for performing an AND operation on N−M most significant bits of the N bit representation, in which the N−M most significant bits are bits in sequence of decreasing significance starting from a bit next to the most significant bit of the N bit representation, to obtain an AND operation output,
an inverter for inverting the AND operation output to obtain an inverted AND operation output, and
a second logical AND gate for performing an AND operation on the inverted AND operation output and the most significant bit of the N bit representation, to obtain a second AND operation output;
(II) a logical OR gate for performing an OR operation on the N−M most significant bits, to obtain an OR operation output,
a second inverter for inverting the most significant bit of the N bit representation to obtain an inverted most significant bit, and
a third logical AND gate for performing an AND operation on the OR operation output and the inverted most significant bit of the N bit representation, to obtain a third AND operation output; and
(III) a multiplexer for performing a multiplexing operation of a first bit input which is a largest positive value of the M bit representation, a second bit input which is a largest negative value of the M bit representation and a third bit input of the M least significant bits of the N bit representation, using the second AND operation output and the third AND operation output to select one of the first, second and third bit inputs for outputting as an M bit multiplexer output which is the M bit representation of the signal.

19. The communication device of claim 18,
wherein the largest positive value of the M bit representation is selected for the M bit multiplexer output when the second AND operation output indicates positive saturation for the converting;
wherein the largest negative value of the M bit representation is selected for the M bit multiplexer output when the third AND operation output indicates negative saturation for the converting; and
wherein the M least significant bits of the N bit representation is selected for the M bit output when the second AND operation output does not indicate positive saturation for the converting and the third AND operation output does not indicate negative saturation for the converting.

20. The communication device of claim 18, wherein the N bit representation is a fixed point number representation of an integer value, a fractional value or a combination of an integer value and a fractional value.

* * * * *